United States Patent [19]

Fossum et al.

[11] Patent Number: 5,471,515
[45] Date of Patent: Nov. 28, 1995

[54] ACTIVE PIXEL SENSOR WITH INTRA-PIXEL CHARGE TRANSFER

[75] Inventors: Eric R. Fossum, LaCrescenta; Sunetra Mendis, Pasadena; Sabrina E. Kemeny, LaCrescenta, all of Calif.

[73] Assignee: California Institute of Technology, Pasadena, Calif.

[21] Appl. No.: 188,032

[22] Filed: Jan. 28, 1994

[51] Int. Cl.⁶ .......................... G11C 19/28; H01L 27/14; H01L 27/02; H03K 5/159
[52] U.S. Cl. .......................... 377/60; 257/239; 257/292; 257/294; 327/94
[58] Field of Search .......................... 257/239, 292, 257/294, 369–371; 377/60; 327/91, 94

[56] References Cited

U.S. PATENT DOCUMENTS

| | | | |
|---|---|---|---|
| 3,623,132 | 11/1971 | Green | 377/60 |
| 4,093,872 | 6/1978 | Hartman et al. | 377/60 |
| 4,155,094 | 5/1979 | Ohba et al. | 257/292 |
| 4,287,441 | 9/1981 | Smith | 307/353 |
| 4,309,624 | 1/1982 | Hynecek et al. | 257/239 |
| 4,683,580 | 7/1987 | Matsunaga | 377/60 |
| 4,859,624 | 8/1989 | Goto | 257/371 |
| 5,184,203 | 2/1993 | Taguchi | 257/370 |
| 5,192,990 | 3/1993 | Stevens | 377/60 |
| 5,198,880 | 3/1993 | Taguchi et al. | 257/370 |
| 5,323,052 | 6/1994 | Koyama | 257/294 |

FOREIGN PATENT DOCUMENTS 5235317  9/1993  Japan .......................... 257/258

*Primary Examiner*—Gene M. Munson
*Attorney, Agent, or Firm*—Michael L. Keller; Robert M. Wallace

[57] ABSTRACT

An imaging device formed as a monolithic complementary metal oxide semiconductor integrated circuit in an industry standard complementary metal oxide semiconductor process, the integrated circuit including a focal plane array of pixel cells, each one of the cells including a photogate overlying the substrate for accumulating photo-generated charge in an underlying portion of the substrate, a readout circuit including at least an output field effect transistor formed in the substrate, and a charge coupled device section formed on the substrate adjacent the photogate having a sensing node connected to the output transistor and at least one charge coupled device stage for transferring charge from the underlying portion of the substrate to the sensing node.

18 Claims, 2 Drawing Sheets

5,471,515

ACTIVE PIXEL SENSOR WITH INTRA-PIXEL CHARGE TRANSFER

ORIGIN OF THE INVENTION

The invention described herein was made in the performance of work under a NASA contract, and is subject to the provisions of Public Law 96-517 (35 USC 202) in which the Contractor has elected to retain title.

BACKGROUND OF THE INVENTION

1. Technical Field

The invention is related to semiconductor imaging devices and in particular to a silicon imaging device which can be fabricated using a standard CMOS process.

2. Background Art

There are a number of types of semiconductor imagers, including charge coupled devices, photodiode arrays, charge injection devices and hybrid focal plane arrays. Charge coupled devices enjoy a number of advantages because they are an incumbent technology, they are capable of large formats and very small pixel size and they facilitate noise-less charge domain processing techniques (such as binning and time delay integration). However, charge coupled device imagers suffer from a number of disadvantages. For example, they exhibit destructive signal read-out and their signal fidelity decreases as the charge transfer efficiency raised to the power of the number of stages, so that they must have a nearly perfect charge transfer efficiency. They are particularly susceptible to radiation damage, they require good light shielding to avoid smear and they have high power dissipation for large arrays.

In order to ameliorate the charge transfer inefficiency problem, charge coupled device (CCD) imagers are fabricated with a specialized CCD semiconductor fabrication process to maximize their charge transfer efficiency. The difficulty is that the standard CCD process is incompatible with complementary metal oxide semiconductor (CMOS) processing, while the image signal processing electronics required for the imager are best fabricated in CMOS. Accordingly, it is impractical to integrate on-chip signal processing electronics in a CCD imager. Thus, the signal processing electronics is off-chip. Typically, each column of CCD pixels is transferred to a corresponding cell of a serial output register, whose output is amplified by a single on-chip amplifier (e.g., a source follower transistor) before being processed in off-chip signal processing electronics. As a result, the read-out frame rate is limited by the rate at which the on-chip amplifier can handle charge packets divided by the number of pixels in the imager.

The other types of imager devices have problems as well. Photodiode arrays exhibit high noise due to so-called kTC noise which makes it impossible to reset a diode or capacitor node to the same initial voltage at the beginning of each integration period. Photodiode arrays also suffer from lag. Charge injection devices also suffer from high noise, but enjoy the advantage of non-destructive readout over charge coupled devices.

Hybrid focal plane arrays exhibit less noise but are prohibitively expensive for many applications and have relatively small array sizes (e.g., 512-by-512 pixels).

What is needed is an imager device which has the low kTC noise level of a CCD without suffering from the destructive readout tendencies of a CCD.

SUMMARY OF THE DISCLOSURE

The invention is embodied in an imaging device formed as a monolithic complementary metal oxide semiconductor integrated circuit in an industry standard complementary metal oxide semiconductor process, the integrated circuit including a focal plane array of pixel cells, each one of the cells including a photogate overlying the substrate for accumulating photo-generated charge in an underlying portion of the substrate, a readout circuit including at least an output field effect transistor formed in the substrate, and a charge coupled device section formed on the substrate adjacent the photogate having a sensing node connected to the output transistor and at least one charge coupled device stage for transferring charge from the underlying portion of the substrate to the sensing node.

In a preferred embodiment, the sensing node of the charge coupled device stage includes a floating diffusion, and the charge coupled device stage includes a transfer gate overlying the substrate between the floating diffusion and the photogate. This preferred embodiment can further include apparatus for periodically resetting a potential of the sensing node to a predetermined potential, including a drain diffusion connected to a drain bias voltage and a reset gate between the floating diffusion and the drain diffusion, the reset gate connected to a reset control signal.

Preferably, the output transistor is a field effect source follower transistor, the floating diffusion being connected to a gate of the source follower transistor. Preferably, the readout circuit further includes a double correlated sampling circuit having an input node connected to the output transistor. In the preferred implementation, the double correlated sampling circuit samples the floating diffusion immediately after it has been reset at one capacitor and then, later, at the end of the integration period at another capacitor. The difference between the two capacitors is the signal output. In accordance with a further refinement, this difference is corrected for fixed pattern noise by subtracting from it another difference sensed between the two capacitors while they are temporarily shorted.

DETAILED DESCRIPTION OF THE PREFERRED EMBODIMENTS

Figure 1:
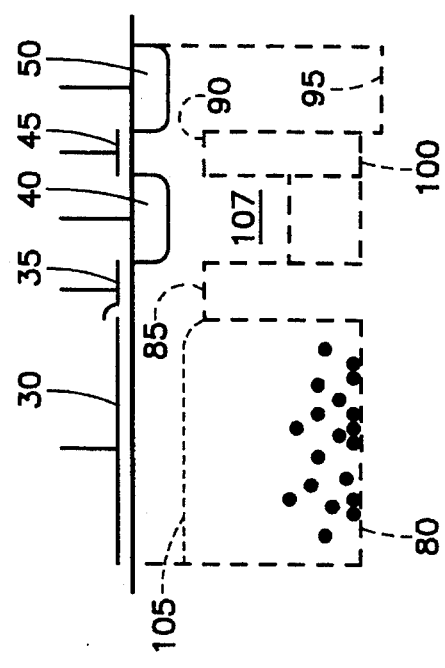
FIG. 1 is a diagram illustrating the architecture of an individual focal plane cell of the invention.
Figure 2:
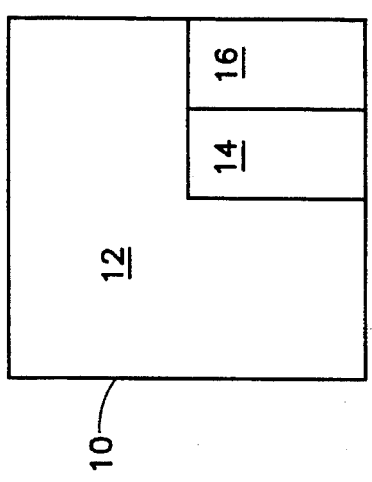
FIG. 2 is a plan view of an integrated circuit constituting a focal plane array of cells of the type illustrated in FIG. 1.
Figure 3:
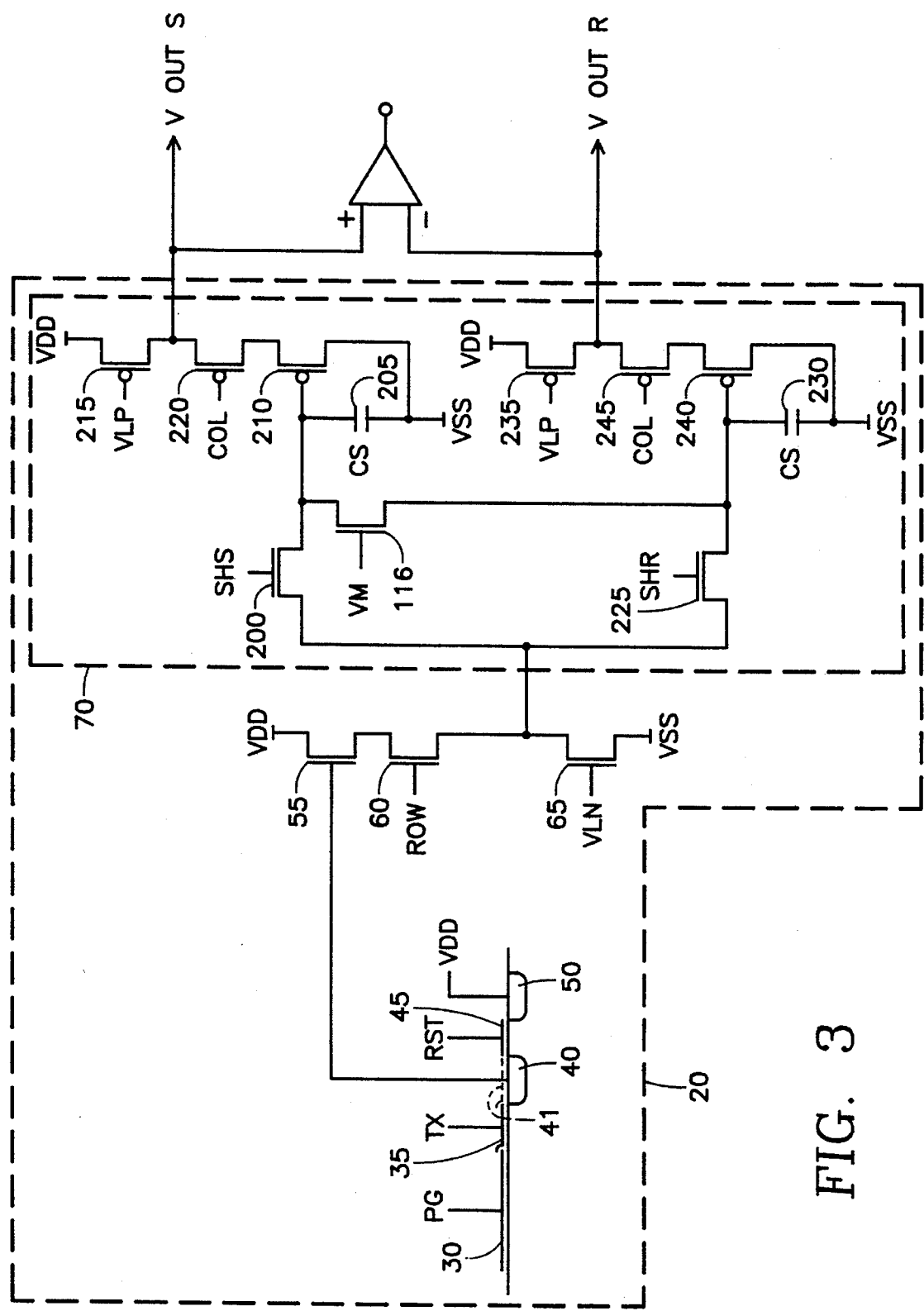
FIG. 3 is a schematic diagram of the cell of FIG. 1.

FIG. 1 is a simplied block diagram of one pixel cell 10 of a focal plane array of many such cells formed in an integrated circuit. Each cell 10 includes a photogate 12, a charge transfer section 14 adjacent the photogate 12 and a readout circuit 16 adjacent the charge transfer section 14. FIG. 2 shows a focal plane array of many cells 10 formed on a silicon substrate 20. FIG. 3 is a simplified schematic diagram of a cell 10. Referring to FIG. 3, the photogate 12 consists of a relative large photogate electrode 30 overlying the substrate 20. The charge transfer section 14 consists of a transfer gate electrode 35 adjacent the photogate electrode 30, a floating diffusion 40, a reset electrode 45 and a drain diffusion 50. The readout circuit 16 consists of a source follower field effect transistor (FET) 55, a row select FET 60, a load FET 65 and a correlated double sampling circuit 70.

Figure 4:
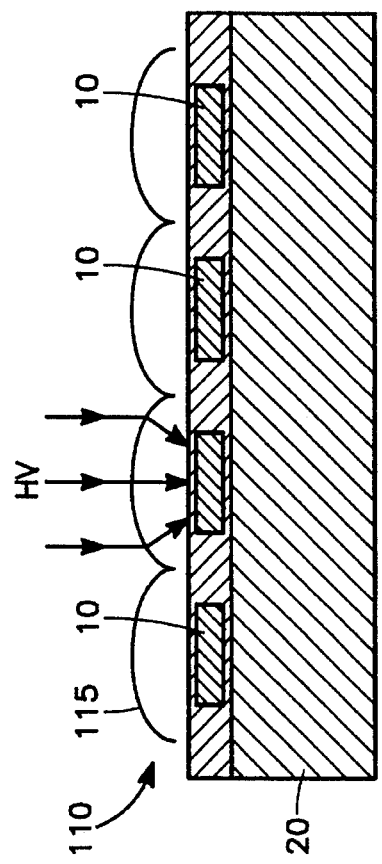
FIG. 4 is a graph of the surface potential in the the charge transfer section of the cell of FIG. 3

Referring to the surface potential diagram of FIG. 4, the photogate electrode 30 is held by a photogate signal PG at a positive voltage to form a potential well 80 in the substrate 20 in which photo-generated charge is accumulated during an integration period. The transfer gate electrode 35 is initially held at a less positive voltage by a transfer gate signal TX to form a potential barrier 85 adjacent the potential well 80. The floating diffusion 40 is connected to the gate of the source follower FET 55 whose drain is connected to a drain supply voltage VDD. The reset electrode 45 is initially held by a reset signal RST at a voltage corresponding to the voltage on the transfer gate 30 to form a potential barrier 90 thereunder. The drain supply voltage VDD connected to the drain diffusion 50 creates a constant potential well 95 underneath the drain diffusion 50.

During the integration period, electrons accumulate in the potential well 80 in proportion to photon flux incident on the substrate 20 beneath the photogate electrode 30. At the end of the integration period, the surface potential beneath the floating diffusion 40 is quickly reset to a potential level 100 slightly above the potential well 95. This is accomplished by the reset signal RST temporarily increasing to a higher positive voltage to temporarily remove the potential barrier 90 and provide a downward potential staircase from the transfer gate potential barrier 85 to the drain diffusion potential well 95, as indicated in the drawing of FIG. 4. After the reset gate 45 is returned to its initial potential (restoring the potential barrier 90), the readout circuit 70 briefly samples the potential of the floating diffusion 40, and then the cell 10 is ready to transfer the photo-generated charge from beneath the photogate electrode 30. For this purpose, the photogate signal PG decreases to a less positive voltage to form a potential barrier 105 beneath the photogate electrode 30 and thereby provide a downward staircase surface potential from the photogate electrode 30 to the potential well 100 beneath the floating diffusion 40. This transfers all of the charge from beneath the photogate electrode 30 to the floating diffusion 40, changing the potential of the floating diffusion 40 from the level (100) at which it was previously reset to a new level 107 indicative of the amount of charge accumulated during the integration period. This new potential of the floating diffusion 40 is sensed at the source of the source follower FET 55. However, before the readout circuit 70 samples the source of the source follower FET 55, the photogate signal PG returns to its initial (more positive) voltage. The entire process is repeated for the next integration period.

The readout circuit 70 consists of a signal sample and hold (S/H) circuit including an S/H FET 200 and a signal store capacitor 205 connected through the S/H FET 200 and through the row select FET 60 to the source of the source follower FET 55. The other side of the capacitor 205 is connected to a source bias voltage VSS. The one side of the capacitor 205 is also connected to the gate of an output FET 210. The drain of the output FET is a connected through a column select FET 220 to a signal sample output node VOUTS and through a load FET 215 to the drain voltage VDD. A signal called "signal sample and hold" (SHS) briefly turns on the S/H FET 200 after the charge accumulated beneath the photogate electrode 30 has been transferred to the floating diffusion 40, so that the capacitor 205 stores the source voltage of the source follower FET 55 indicating the amount of charge previously accumulated beneath the photogate electrode 30.

The readout circuit 70 also consists of a reset sample and hold (S/H) circuit including an S/H FET 225 and a signal store capacitor 230 connected through the S/H FET 225 and through the row select FET 60 to the source of the source follower FET 55. The other side of the capacitor 230 is connected to the source bias voltage VSS. The one side of the capacitor 230 is also connected to the gate of an output FET 240. The drain of the output FET 240 is connected through a column select FET 245 to a reset sample output node VOUTR and through a load FET 235 to the drain voltage VDD. A signal called "reset sample and hold" (SHR) briefly turns on the S/H FET 225 immediately after the reset signal RST has caused the resetting of the potential of the floating diffusion 40, so that the capacitor 230 stores the voltage at which the floating diffusion has been reset to.

The readout circuit provides correlated double sampling of the potential of the floating diffusion, in that the charge integrated beneath the photogate 12 each integration period is obtained at the end of each integration period from the difference between the voltages at the output nodes VOUTS and VOUTR of the readout circuit 70. This eliminates the effects of kTC noise because the difference between VOUTS and VOUTR is independent of any variation in the reset voltage RST, a significant advantage.

Figure 5:
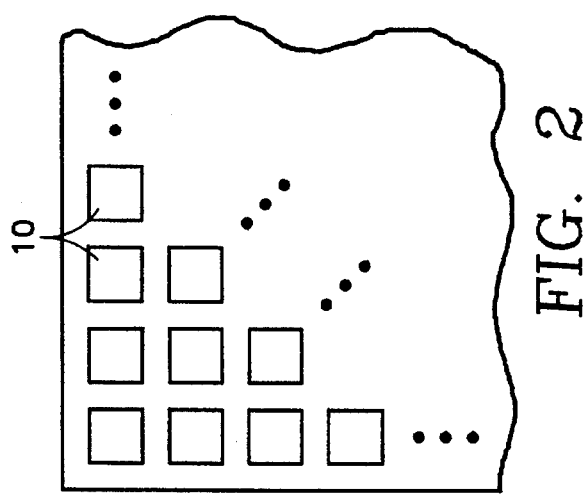
FIG. 5 is a cross-sectional view of an alternative embodiment of the focal plane array of FIG. 2 including a microlens layer.

Referring to FIG. 5, a transparent refractive microlens layer 110 may be deposited over the top of the focal plane array of FIG. 2. The microlens layer 110 consists of spherical portions 115 centered over each of the cells 10 and contoured so as to focus light toward the center of each photogate 12. This has the advantage of using light that would otherwise fall outside of the optically active region of the photogate 12. For example, at least some of the light ordinarily incident on either the charger transfer section 14 or the readout circuit 16 (FIG. 1) would be sensed in the photogate area with the addition of the microlens layer 110.

Preferably, the focal plane array corresponding to FIGS. 1–4 is implemented in CMOS silicon using an industry standard CMOS fabrication process. Preferably, each of the FETs is a MOSFET, the FETs 55, 60, 65, 200 and 225 being n-channel devices and the FETs 210, 220, 225, 230. 240, 245 being p-channel devices. The n-channel MOSFETS and the CCD channel underlying the gate electrodes 30, 35, 45 and the diffusions 40 and 50 may be located in a p-well while the remaining (p-channel) devices are located outside of the p-well. The gate voltage VLP applied to the gates of the p-channel load FETs 215 and 235 is a constant voltage on the order of +2.5 volts. The gate voltage VLN applied to the n-channel load FET 65 is a constant voltage on the order of +1.5 volts.

Since the charge transfer section 14 involves only a single CCD stage between the photogate 12 and the floating diffusion 40 in the specific embodiment of FIG. 3, there is no loss due to charge transfer inefficiency and therefore there is no need to fabricate the device with a special CCD process. As a result, the readout circuit 70 as well as the output circuitry of the FETs 55, 60 and 65 can be readily implemented as standard CMOS circuits, making them extremely inexpensive. However, any suitable charge coupled device architecture may be employed to implement the charge transfer section 14, including a CCD having more than one stage. For example, two or three stages may be useful for buffering two or three integration periods.

Other implementations of the concept of the invention may be readily constructed by the skilled worker in light of the foregoing disclosure. For example, the floating diffusion 40 may instead be a floating gate electrode. The signal and reset sample and hold circuits of the readout circuit 70 may be any suitable sample and hold circuits. Moreover, shielding of the type well-known in the art may be employed defining an aperture surrounding the photogate 12. Also, the invention may be implemented as a buried channel device.

Another feature of the invention which is useful for eliminating fixed pattern noise due to variations in FET threshold voltage across the substrate 20 is a shorting FET 116 across the sampling capacitors 205, 235. After the accumulated charge has been measured as the potential difference between the two output nodes VOUTS and VOUTR, a shorting signal VM is temporarily applied to the gate of the shorting FET 116 and the VOUTS-to-VOUTR difference is measured again. This latter difference is a measure of the disparity between the threshold voltages of the output FETs 210, 240, and may be referred to as the fixed pattern difference. The fixed pattern difference is subtracted from the difference between VOUTS and VOUTR measured at the end of the integration period, to remove fixed pattern noise.

As previously mentioned herein, a floating gate may be employed instead of the floating diffusion 40. Such a floating gate is indicated schematically in FIG. 3 by a simplified dashed line floating gate electrode 41.

Preferably, the invention is fabricated using an industry standard CMOS process, so that all of the dopant concentrations of the n-channel and p-channel devices and of the various diffusions are in accordance with such a process. In one implementation, the area of the L-shaped photogate 12 (i.e., the photogate electrode 30) was about 100 square microns; the transfer gate electrode 35 and the reset gate electrode were each about 1.5 microns by about 6 microns; the photogate signal PG was varied between about +5 volts (its more positive voltage) and about 0 volts (its less positive voltage; the transfer gate signal TX was about +2.5 volts; the reset signal RST was varied between about +5 volts (its more positive voltage) and about +2.5 volts (its less positive voltage); the drain diffusion 50 was held at about +5 volts.

While the invention has been described in detail by specific reference to preferred embodiments, it is understood that variations and modifications may be made without departing from the true spirit and scope of the invention.

What is claimed is:

1. An imaging device including a monolithic semiconductor integrated circuit substrate, said imaging device comprising a focal plane array of pixel cells, each one of said cells comprising:

a photogate overlying said substrate for accumulating photo-generated charge in an underlying portion of said substrate;

a readout circuit comprising at least an output transistor formed in said substrate;

a charge coupled device section formed on said substrate adjacent said photogate having a sensing node connected to said output transistor and at least one charge coupled device stage for transferring charge from said underlying portion of said substrate to said sensing node; and wherein said readout circuit is a complementary metal oxide semiconductor (CMOS) circuit formed on said substrate, said substrate being of a first conductivity type, said CMOS circuit comprising plural metal oxide field effect transistors of a first conductivity type, a well region of a second conductivity type in said substrate and plural metal oxide semiconductor transistors of a second conductivity type formed in said well region.

2. The imaging device of claim 1 wherein:

said sensing node of said charge coupled device section comprises a floating node; and said charge coupled device stage comprises a transfer gate between said floating node and said photogate.

3. The imaging device of claim 2 wherein said floating node is one of: (a) a floating diffusion, and (b) a floating gate.

4. The imaging device of claim 2 further comprising:

a drain diffusion connected to a drain bias voltage; and a reset gate between said floating node and said drain diffusion, said reset gate connected to a reset control signal.

5. The imaging device of claim 4 wherein said output transistor comprises a field effect source follower transistor, said floating node being connected to a gate of said source follower transistor.

6. The imaging device of claim 4 wherein said readout circuit further comprises a double correlated sampling circuit comprising:

a pair of sample and hold field effect transistors formed in said substrates, each sample and hold field effect transistor having one of a source and drain thereof connected to a source of said source follower transistor;

a pair of sample and hold capacitors connected to the other one of the source and drain of a respective one of said pair of sample and hold transistors; and means for sensing a potential of each of said sample and hold capacitors at respective intervals.

7. The imaging device of claim 6 further comprising means for sensing a difference between the potentials of said pair of sample and hold capacitors.

8. The imaging device of claim 1 further comprising means for periodically resetting a potential of said sensing node to a predetermined potential.

9. The imaging device of claim 1 wherein said readout circuit further comprises a double correlated sampling circuit having an input node connected to said output transistor.

10. The imaging device of claim 1 further comprising a micro-lens layer overlying said substrate, said micro-lens layer comprising:

a refractive layer;

individual lenses formed in said layer in regisration with individual ones of said cells, each of said individual lenses having a curvature for focusing light toward a center portion of the respective cell.

11. The imaging device of claim 10 wherein said refractive layer comprises a polymer.

12. The imaging device of claim 11 wherein said refractive layer comprises polyimide.

13. The imaging device of claim 10 wherein each of said individual lenses covers portions of the corresponding cell including said photogate as well as said charge coupled device stage and said readout circuit.

14. The device of claim 1 wherein said charge transfer device constitutes a single charge coupled device stage for transferring charge from said underlying portion of said substrate to said sensing node.

15. The device of claim 1 wherein said CMOS circuit comprises a double correlated sampling circuit.

16. An imaging device including a monolithic semiconductor integrated circuit substrate, said imaging device comprising a focal plane array of pixel cells, each one of said cells comprising:

a photogate overlying said substrate for accumulating photo-generated charge in an underlying portion of said substrate;

a readout circuit comprising at least an output transistor formed in said substrate;

a charge coupled device section formed on said substrate adjacent said photogate having a sensing node connected to said output transistor and at least one charge coupled device stage for transferring charge from said underlying portion of said substrate to said sensing node;

wherein said sensing node of said charge coupled device stage comprises a floating node and said charge coupled device stage comprises a transfer gate between said floating node and said photogate;

a drain diffusion connected to a drain bias voltage;

a reset gate between said floating node and said drain diffusion, said reset gate connected to a reset control signal;

wherein said readout circuit further comprises a double correlated sampling circuit comprising:

a pair of sample and hold field effect transistors formed in said substrate, each sample and hold field effect transistor having one of a source and drain thereof connected to a source of said output transistor;

a pair of sample and hold capacitors connected to the other one of the source and drain of a respective one of said pair of sample and hold transistors;

means for sensing a potential of each of said sample and hold capacitors at respective intervals; and means for shorting across each of said pair of sample and hold capacitors simultaneously while said means for sensing measures a fixed pattern noise difference.

17. An imaging device including a monolithic semiconductor integrated circuit substrate, said imaging device comprising a focal plane array of pixel cells, each one of said cells comprising:

a photogate overlying said substrate for accumulating photo-generated charge in an underlying portion of said substrate;

a readout circuit comprising at least an output transistor formed in said substrate;

a charge coupled device section formed on said substrate adjacent said photogate having a sensing node connected to said output transistor and at least one charge coupled device stage for transferring charge from said underlying portion of said substrate to said sensing node;

wherein said sensing node of said charge coupled device stage comprises a floating node and said charge coupled device stage comprises a transfer gate between said floating node and said photogate;

a drain diffusion connected to a drain bias voltage;

a reset gate between said floating node and said drain diffusion, said reset gate connected to a reset control signal;

wherein said readout circuit further comprises a double correlated sampling circuit comprising:

a pair of sample and hold field effect transistors formed in said substrate, each sample and hold field effect transistor having one of a source and drain thereof connected to a source of said output transistor;

a pair of sample and hold capacitors connected to the other one of the source and drain of a respective one of said pair of sample and hold transistors;

means for sensing a potential of each of said sample and hold capacitors at respective intervals;

wherein said focal plane array of cells is organized by rows and columns of said cells, and wherein said means for sensing comprises:

a row select field effect transistor formed in said substrate having its source and drain connected between said source of said source follower transistor and said pair of sample and hold transistors and a gate connected to a row select signal;

a pair of sample and hold output transistors having respective gates and sources connected across respective ones of said pair of sample and hold capacitors, and having respective drains;

respective differential output nodes of said correlated double sampling circuit; and a pair of column select transistors formed in said substrate each having a source and drain connected between a drain of a respective one of said sample and hold output transistors and a gate connected to a column select signal.

18. The imaging device of claim 17 wherein each of said transistors is a metal oxide field effect transistor, said source follower transistor, said row select transistor and said pair sample and hold transistors being n-channel devices, said pair of sample and hold output transistors and said pair of column select transistors being p-channel devices.

* * * * *